United States Patent
Eroz et al.

(10) Patent No.: US 12,199,757 B1
(45) Date of Patent: Jan. 14, 2025

(54) OPTIMIZED CODE-SPLIT SYMBOL CONSTELLATIONS

(71) Applicant: Hughes Network Systems, LLC, Germantown, MD (US)

(72) Inventors: Mustafa Eroz, Rockville, MD (US); Lin-Nan Lee, Potomac, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 0 days.

(21) Appl. No.: 18/356,074

(22) Filed: Jul. 20, 2023

(51) Int. Cl.
 *H04L 1/00* (2006.01)
 *H03M 13/25* (2006.01)
(52) U.S. Cl.
 CPC ........ *H04L 1/0057* (2013.01); *H03M 13/255* (2013.01)
(58) Field of Classification Search
 None
 See application file for complete search history.

(56) References Cited

U.S. PATENT DOCUMENTS

| | | | | |
|---|---|---|---|---|
| 10,873,418 | B2 * | 12/2020 | Kons | H04L 1/0048 |
| 2007/0098110 | A1 * | 5/2007 | Schmidt | H04L 1/0065 375/298 |
| 2016/0344420 | A1 * | 11/2016 | Jeong | H03M 13/2906 |
| 2017/0353340 | A1 * | 12/2017 | Raphaeli | H04L 27/3411 |
| 2018/0102933 | A1 | 4/2018 | Schneider et al. | |
| 2023/0084537 | A1 | 3/2023 | Pan et al. | |

FOREIGN PATENT DOCUMENTS

| | | | | | |
|---|---|---|---|---|---|
| CN | 107534515 | A | * | 1/2018 | ........... H04L 1/0003 |
| HU | E026033 | T2 | * | 5/2016 | |
| WO | WO-2018031952 | A1 | * | 2/2018 | ............... H04B 1/00 |

OTHER PUBLICATIONS

Barrueco Ron et al: "Constellation Design for Future Communication Systems: A Comprehensive Survey", IEEEAccess Jun. 21, 2021, 20 pages.
Ferrand Paul et al: "High-Rate Regular APSK Constellations", IEEE Transactions On Communications, vol. 67, No. 3, Mar. 2019, 9 pages.

* cited by examiner

*Primary Examiner* — Guerrier Merant
(74) *Attorney, Agent, or Firm* — Kilpatrick Townsend & Stockton LLP (57) ABSTRACT

Various arrangements for improving performance of code split communications are presented herein. A second portion of a first codeword and a third portion of a second codeword can be transmitted using symbols such that each transmitted symbol includes bits from the second portion of the first codeword and bits from the third portion of the second codeword. At a receiver, decoder inputs can be generated for the third portion of the second codeword based on an optimized constellation and the second portion of the first codeword. The second portion of the first codeword is used to identify a label group of the optimized constellation and eliminate all other label groups of the plurality of label groups. Within each label group, symbol labels are Gray labeled. However, at least a first symbol label is not Gray labeled with an adjacent second symbol label of a different label group.

20 Claims, 11 Drawing Sheets

OPTIMIZED CODE-SPLIT SYMBOL CONSTELLATIONS

BACKGROUND

Improving the performance of wirelessly transmitted signals is beneficial for many reasons. Improvements are detailed herein that allow for a lower error rate at a same signal to noise ratio (SNR), which can allow for a greater amount of data to be transmitted over a fixed amount of bandwidth. Similarly, improvements detailed herein can allow for maintaining a same error rate with a lower SNR.

SUMMARY

In some embodiments, methods for improving performance of code split communications are presented herein. A method can include splitting, by a transmission system, a first codeword into a first portion and a second portion. The method can include splitting, by the transmission system, a second codeword into a third portion and a fourth portion. The method can include transmitting, by the transmission system, the second portion of the first codeword and the third portion of the second codeword together as a plurality of symbols such that each transmitted symbol of the plurality of symbols comprises a first number of bits from the second portion of the first codeword and a second number of bits from the third portion of the second codeword. The method can include decoding, by a receiver system, the first codeword such that the first portion and the second portion of the first codeword are determined to be properly decoded. The method can include generating, by the receiver system, decoder inputs for the third portion of the second codeword using an optimized constellation and the second portion of the first codeword. The second portion of the first codeword can be used to identify a label group of a plurality of label groups of the optimized constellation and eliminate all other label groups of the plurality of label groups. Within each label group of the plurality of label groups, symbol labels can be Gray labeled. At least a first symbol label may not be Gray labeled with an adjacent second symbol label, the first symbol label and the second symbol label being members of different label groups of the plurality of label groups.

Embodiments of such a method can include one or more of the following features: The optimized constellation can be an optimized 16 symbol Amplitude and Phase-Shift Keying (APSK) constellation. The first number of bits can be one and the second number of bits can be three. At a same radius from the origin, adjacent symbols on the optimized constellation alternate between being members of a first label group and a second label group. The first and second number of bits can be two. Each label group of the plurality of label groups can include two symbols associated with each radius from the origin. The optimized constellation can be an optimized 32 symbol APSK constellation. Three label groups of the plurality of label groups each can include eight symbols associated with a radius from the origin of the optimized constellation. The first number of bits can be two and the second number of bits can be three. The optimized constellation can be an optimized 64 symbol Amplitude and Phase-Shift Keying (APSK) constellation. Two label groups of the plurality of label groups can each have four symbols associated with each radius of a set of four possible radii from the origin of the optimized constellation. One label group of the plurality of label groups can have eight symbols associated with a first radius and eight symbols associated with a radius amplitude. The first number of bits can be two and the second number of bits can be four. The method can include generating, by the receiver system, decoder inputs for the third portion of the second codeword is performed using the second portion of the first codeword and one or more precomputed log-likelihood ratio (LLR) tables that are based on the optimized constellation.

In some embodiments, systems for improving performance of code split communications are provided. A system can include a satellite gateway system configured to split a first codeword into a first portion and a second portion, split a second codeword into a third portion and a fourth portion, and transmit the second portion of the first codeword and the third portion of the second codeword together as a plurality of symbols such that each transmitted symbol of the plurality of symbols comprises a first number of bits from the second portion of the first codeword and a second number of bits from the third portion of the second codeword. The system can include a receiver system, configured to receive the first codeword and the second codeword via a satellite antenna and decode the first codeword such that the first portion and the second portion of the first codeword are determined to be properly decoded. The receiver system can generate decoder inputs for the third portion of the second codeword using an optimized constellation and the second portion of the first codeword. The second portion of the first codeword can be used to identify a label group of a plurality of label groups of the optimized constellation and eliminate all other label groups of the plurality of label groups. Within each label group of the plurality of label groups, symbol labels can be Gray labeled. At least a first symbol label may not be Gray labeled with an adjacent second symbol label, the first symbol label and the second symbol label being members of different label groups of the plurality of label groups.

Embodiments of such a system can include one or more of the following features: The optimized constellation can be an optimized 16 symbol Amplitude and Phase-Shift Keying (APSK) constellation. The first number of bits can be one and the second number of bits can be three. At a same radius from the origin, adjacent symbols on the optimized constellation can alternate between being members of a first label group and a second label group. The first and second number of bits can be two. Each label group of the plurality of label groups can include two symbols associated with each radius from the origin. The optimized constellation can be an optimized 32 symbol APSK constellation. Three label groups of the plurality of label groups each can include eight symbols associated with a radius from the origin of the optimized constellation. The optimized constellation can be an optimized 64 symbol Amplitude and Phase-Shift Keying (APSK) constellation. Two label groups of the plurality of label groups can each have four symbols associated with each radius of a set of four possible radii from the origin of the optimized constellation. One label group of the plurality of label groups can have eight symbols associated with a first radius and eight symbols associated with a radius amplitude. The satellite gateway system can be connected with the Internet and provides Internet access to the receiver system. The system can include a satellite that relays communication signals between the satellite gateway system and the receiver system. The receiver system being configured to generate decoder inputs for the third portion of the second codeword is performed using the second portion of the first codeword and one or more precomputed log-likelihood ratio (LLR) tables that are based on the optimized constellation.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Conventionally, codewords are transmitted as individual packets, such as wirelessly, on an individual basis. In contrast, code splitting can be performed such that a portion of a first codeword and a portion of a second codeword are transmitted as a packet. By performing such code splitting, each transmitted packet includes data to be used by a receiver to reconstruct two codewords. This arrangement results in a dependency among transmitted packets such that two successively transmitted packets are needed to be received by the receiver in order to reconstruct a codeword. This arrangement can result in the realization of various performance improvements. Such improvements in performance can result in a lower error rate at a same SNR or maintaining a same error rate with a lower SNR. As an example, code splitting can be used for communications between a gateway system and a satellite and/or between a satellite and user equipment (UE).

When code splitting is used, for each symbol encoded using a digital modulation scheme (e.g., digital video broadcasting-satellite (e.g., DVB-S2 (X)), quadrature amplitude modulation (QAM)), a transmitted symbol is constructed to include a number of bits from a first codeword and a number of bits from a second codeword. For example, each transmitted symbol can represent a bit from the first codeword and three bits from the second codeword. More specifically, in this example, the most-significant bit of each symbol corresponds to the first codeword and the least significant bits of each symbol correspond to the second codeword.

When a receiver successfully decodes a codeword having been encoded using such a code splitting arrangement, the receiver has determined that the most significant bit of each symbol, which corresponds to the first codeword, was decoded correctly. As such, in order to decode the remaining bits of the packet corresponding to the next codeword, an alternative (e.g., simplified) constellation mapping can be used. Since a simplified constellation is used for interpreting the remaining bits of each received symbol, there is a reduced chance of an error being made in converting the symbol to digital data.

In order to improve the performance of such arrangements, non-standard constellation labelling can be used by the transmitter system and receiver system. The non-standard constellation labelling can at least partially optimize for two goals: 1) increasing separation on the constellation of labels that have the same most-significant bit or bits (referred to herein as a "label group"); and 2) maintaining Gray coding of adjacent symbols within label groups and to the extent possible within the entirety of the constellation mapping. In order to accomplish these goals, non-standard constellation labelling for symbols may be used. As detailed herein, various arrangements of non-standard constellation labels are provided for various digital modulation schemes that allow for improved performance when used in combination with code splitting.

Figure 1:
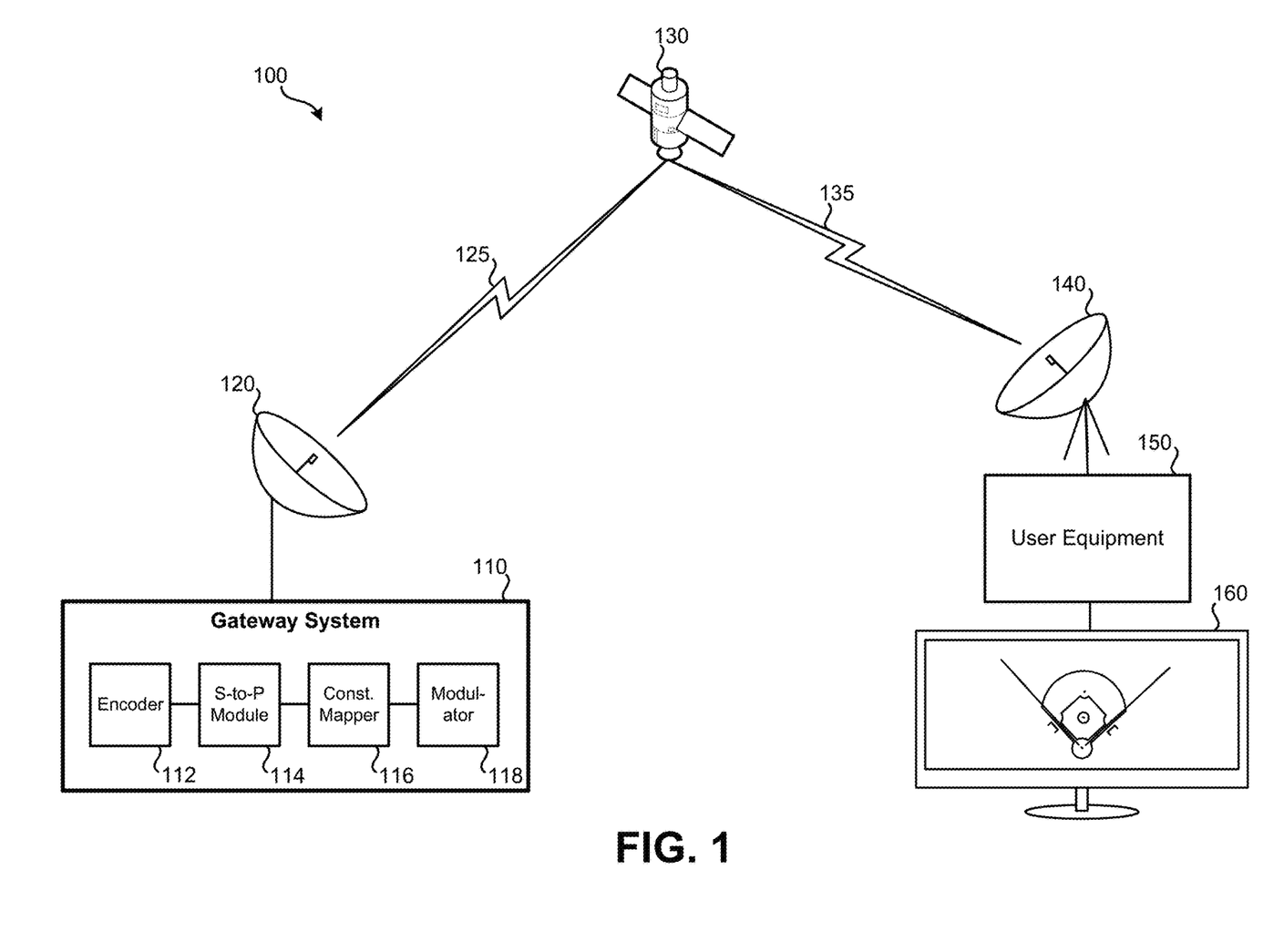
FIG. 1 illustrates an embodiment of a satellite communication system that uses code splitting and an optimized constellation.

Further detail regarding these and other embodiments are provided in relation to the figures. FIG. 1 illustrates an embodiment of a satellite communication system 100 that uses code splitting and an optimized constellation for encoding and decoding symbols. At a high level, system 100 can include: gateway system 110; satellite antenna 120; satellite 130; satellite antenna 140; and UE 150.

Gateway system 110 can perform bidirectional communication (represented by wireless signals 125) with satellite 130 via satellite antenna 120. Satellite 130 can relay wireless signals 125 as wireless signals 145 to satellite antenna 140. Such communications can be referred to as downlink communications. Uplink communications can also be performed, which include transmissions from satellite antenna 140 to satellite 130 as part of wireless signals 135, which are relayed by satellite 130 to satellite antenna 120 as part of wireless signals 125.

Satellite 130 can be in low earth orbit (LEO), medium earth orbit (MEO), or geosynchronous orbit (GEO). If in GEO, satellite 130 may continuously provide relay services between gateway system 110 and some number of UE, such as hundreds or thousands of pieces of UE scattered over a geographical area. If satellite 130 is in LEO or MEO orbit, multiple satellites may be used in concert to provide continuous relay services between some number of UE and gateway system 110.

Gateway system 110 can serve various functions, including providing various pieces of user equipment with public and/or private network access, Internet access, and/or direct broadcast television services. Gateway system 110 can include: encoder 112; serial-to-parallel (S-to-P) module 114, constellation mapper 116; and modulator 118. These components of gateway system 110 may include one or more special-purpose or general-purpose processors. Such special-purpose processors may include processors that are specifically designed to perform the functions of the components detailed herein. Such special-purpose processors may be ASICs or FPGAs which are general-purpose components that are physically and electrically configured to perform the functions detailed herein. Such general-purpose processors may execute special-purpose software that is stored using one or more non-transitory processor-readable mediums, such as random-access memory (RAM), flash memory, a hard disk drive (HDD), or a solid state drive (SSD).

Encoder 112 can receive digital data from some other component or from a network (e.g., the Internet) that is to be transmitted to user equipment 150. Encoder 112 can create multiple codewords and code split codewords such that S-to-P module 114 is provided with a predefined number of bits from a first codeword and a second codeword. As an example, if the digital modulation scheme to be used is 16 APSK with a 25%-75% encoding scheme, encoder 112 can output a serial sequence of four bits in which the most significant bit corresponds to a portion of a first codeword and the three least significant bits correspond to a portion of a second codeword. S-to-P module 114 can convert a serial sequence of bits to parallel bits. Constellation mapper 116 can use a constellation that uses customized or non-standard constellation labelling, as detailed herein, to convert the parallel bits to a symbol. Modulator 188 then modulates the symbol for transmission via satellite antenna 120. This process may repeat in order to transmit all symbols necessary for a packet to be transmitted to UE 150.

UE 150 can then receive the packet. Further detail about how the data from the packet is obtained is provided in relation to FIG. 2. UE 150 can represent various types of equipment that communicates, via satellite antenna 140, with satellite 130. For example, UE 150 can be an access point (AP) accessible by multiple user devices for network access. UE 150 can be television-specific, such as a modem for allowing access to television broadcast services and/or content delivery services. As illustrated, UE 150 may be connected with television 160 for outputting television channel streams.

While the embodiment of system 200 is focused on satellite communications, the non-standardized constellation labelling arrangements detailed herein can be used for terrestrial communication systems also. Various wireless communication systems and wired communication systems can use the constellation mappings detailed herein.

Figure 2:
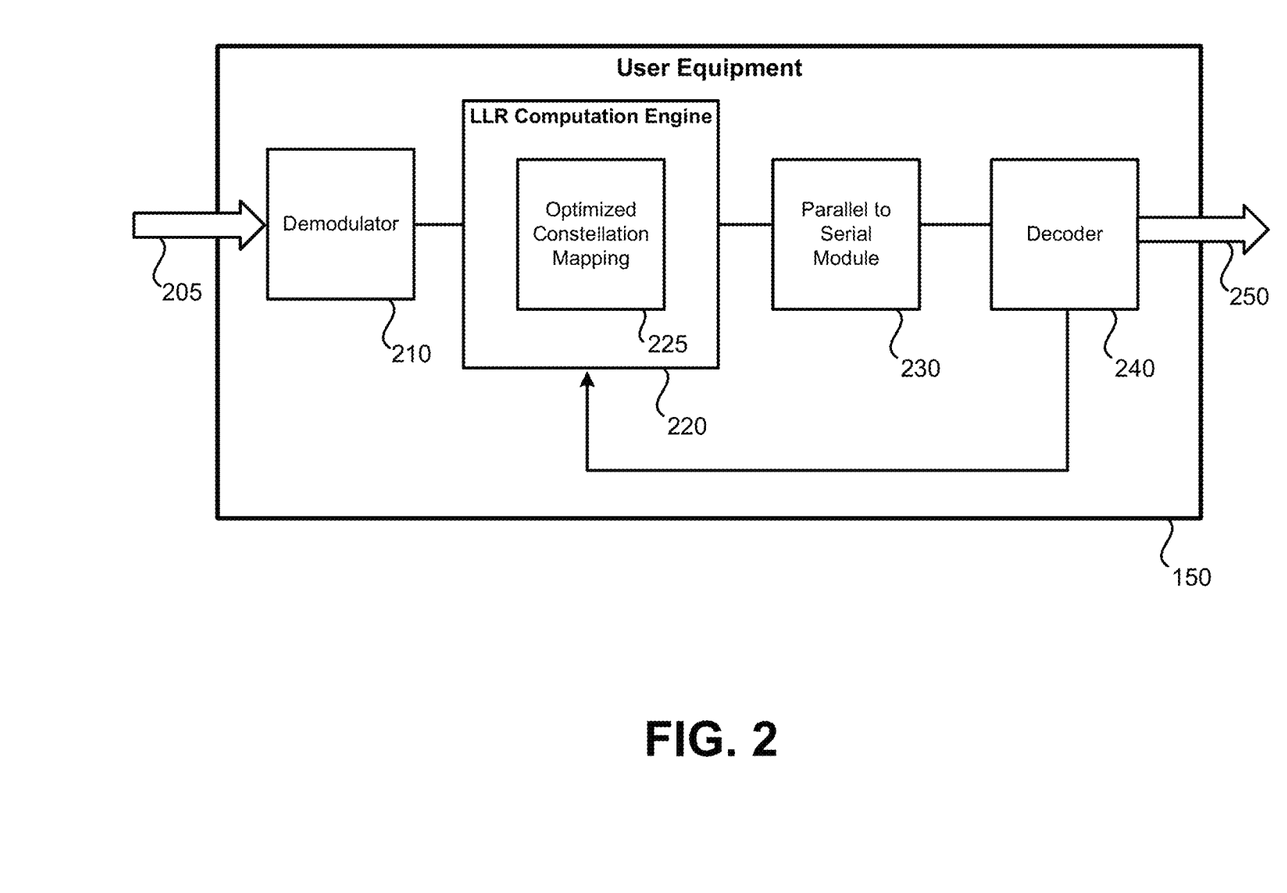
FIG. 2 illustrates an embodiment of user equipment that uses code splitting and an optimized constellation.

FIG. 2 illustrates an embodiment of user equipment 150 that uses code splitting and a non-standard constellation. UE 150 can include: demodulator 210; log-likelihood ratio (LLR) computation engine 220; parallel-to-serial (P-to-S) module 230; and decoder 240. These components of UE 150 may include one or more special-purpose or general-purpose processors. Such special-purpose processors may include processors that are specifically designed to perform the functions of the components detailed herein. Such special-purpose processors may be ASICs or FPGAs which are general-purpose components that are physically and electrically configured to perform the functions detailed herein. Such general-purpose processors may execute special-purpose software that is stored using one or more non-transitory processor-readable mediums, such as random-access memory (RAM), flash memory, a hard disk drive (HDD), or a solid state drive (SSD). While UE 150 is shown in FIG. 1 as being part of a satellite-based communication system, it should be understood that UE 150 can also be used in non-satellite and/or non-television based applications.

A received packet 205 can be demodulated by demodulator 210. LLR computation engine 220 can use feedback from decoder 240 when generating decoder input regarding the received symbols. LLR computation engine 220 has stored or can otherwise access optimized constellation mapping 225. Optimized constellation mapping 225 includes customized or non-standard labelling as detailed in relation to the examples of FIGS. 4-7. P-to-S module 230 converts parallel data to serial data, if needed. Decoder 240 decodes codewords for output as data 250 to another component or device.

A feedback loop can exist between decoder 240 and LLR computation engine 220. When a portion of a first codeword is determined to be properly decoded by decoder 240, data corresponding to the properly decoded portion can be provided back to LLR computation engine 220 for use in identifying the correct symbol labels for a portion of a second codeword transmitted within the same symbol as the portion of the first codeword. The data provided on the feedback loop can be used to utilize the correct most-significant bit or bits of the symbols to narrow the available symbols on the optimized constellation mapping used for obtaining the bits of the portion of the second codeword.

Figure 3:
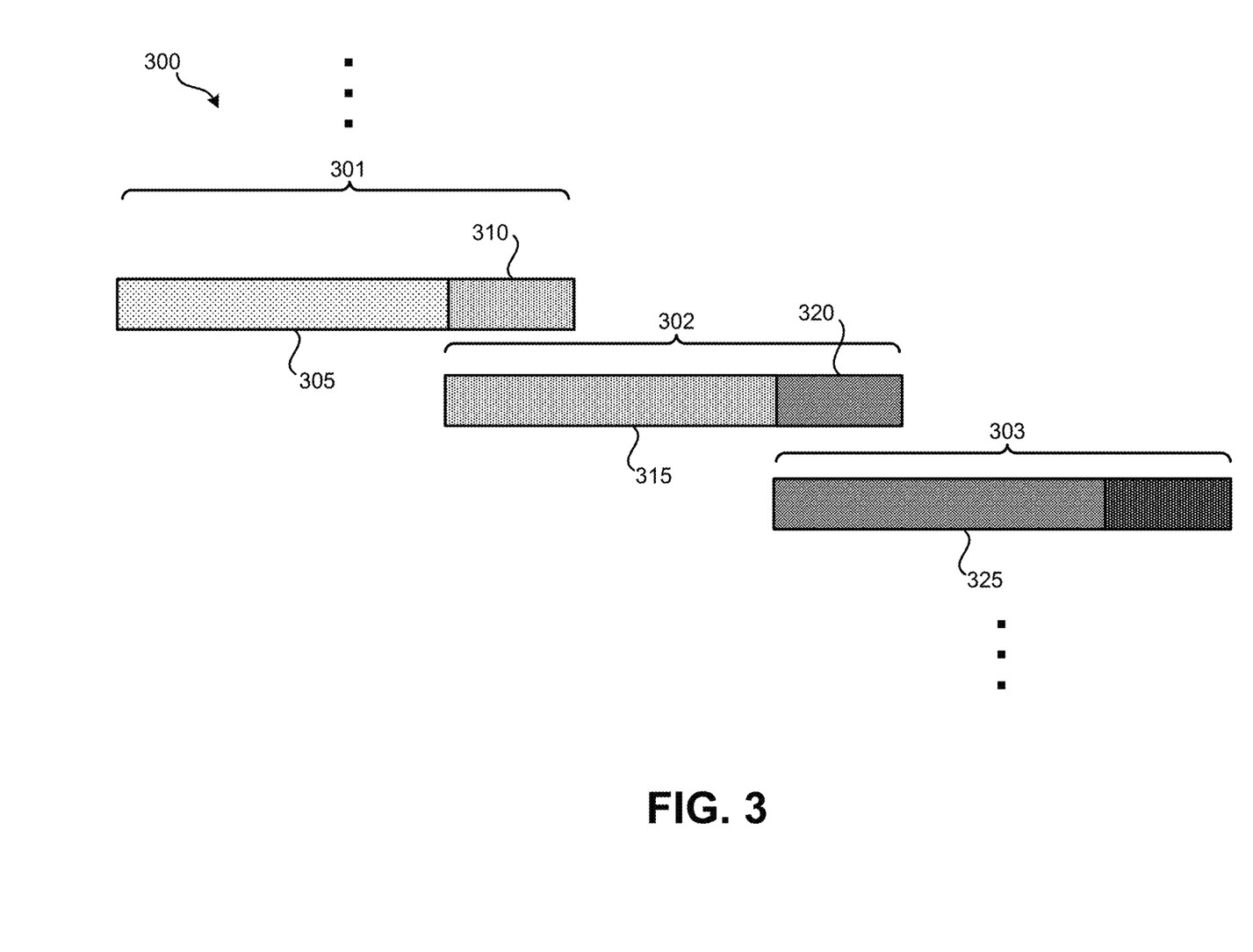
FIG. 3 illustrates an embodiment of code splitting codewords across two packets.

FIG. 3 illustrates an embodiment 300 of code splitting performing across multiple codewords. In embodiment 300, three codewords are shown: codeword 301, codeword 302, and codeword 303. Rather than transmitting each codeword as a packet individually, the codewords are split such that each transmitted packet includes data from two codewords, thus creating dependency among successive packet transmissions. As an example, a packet can include codeword portion 310 (of codeword 301) and codeword portion 315 (of codeword 302). In this example, assume that codeword portion 310 is 25% the size (i.e., number of bits) of codeword portion 315. When mapped to a constellation symbol used for digital modulation, each symbol for transmission can include a bit from codeword portion 310 and three bits from codeword portion 315, thereby maintaining 25% to 75% code splitting. As an example, when four bits are present per symbol, a constellation used for transmission may be the sixteen amplitude and phase-shift keying (16-APSK) digital modulation scheme.

A next packet for transmission would include codeword portion 320 (the remainder of codeword 302) being transmitted in a similar manner with codeword portion 325 (of codeword 303). This cascading pattern of packet transmissions including data from two codewords can continue such that each packet transmission includes data for two codeword and each symbol is chosen by data corresponding to two codewords.

The number of bits included from codeword portion 310 and codeword portion 315 for each symbol is based on the code splitting ratio and the digital modulation scheme used. As another example, 16 APSK can also be used in a 50%/50% code splitting arrangement in which each symbol would include two bits from codeword portion 310 and two bits from codeword portion 315. If 32 APSK is used, which involves 5 bits being mapped into each symbol, two bits from codeword portion 310 may be used with three bits from codeword portion 315 into each symbol for 40%/60% code splitting. As another example, if 64 APSK is used, which involves six bits being mapped into each symbol, two bits from codeword portion 310 may be used with four bits from codeword portion 315 into each symbol for 33%/67% code splitting. Depending on the digital modulation scheme to be used, code splitting can be adjusted such that the proper number of bits are present in consecutive packet portions. Alternatively, the digital modulation scheme to be used can be adjusted based on the code splitting ratio being used.

In FIGS. 4-7, various customized or non-standard constellation labeling arrangements are presented. Each of these labelling arrangements differ from the standardized labeling in that at least some symbols are labeled differently. Accordingly, in order to take advantage of these customized constellation labeling arrangements, the transmitter system (e.g., gateway system) and receiver (e.g., UE) need to have access to the same non-standard constellation labeling arrangements. For each of FIGS. 4-7, the x-axis is the I-axis, and the y-axis is the Q-axis.

Figure 4:
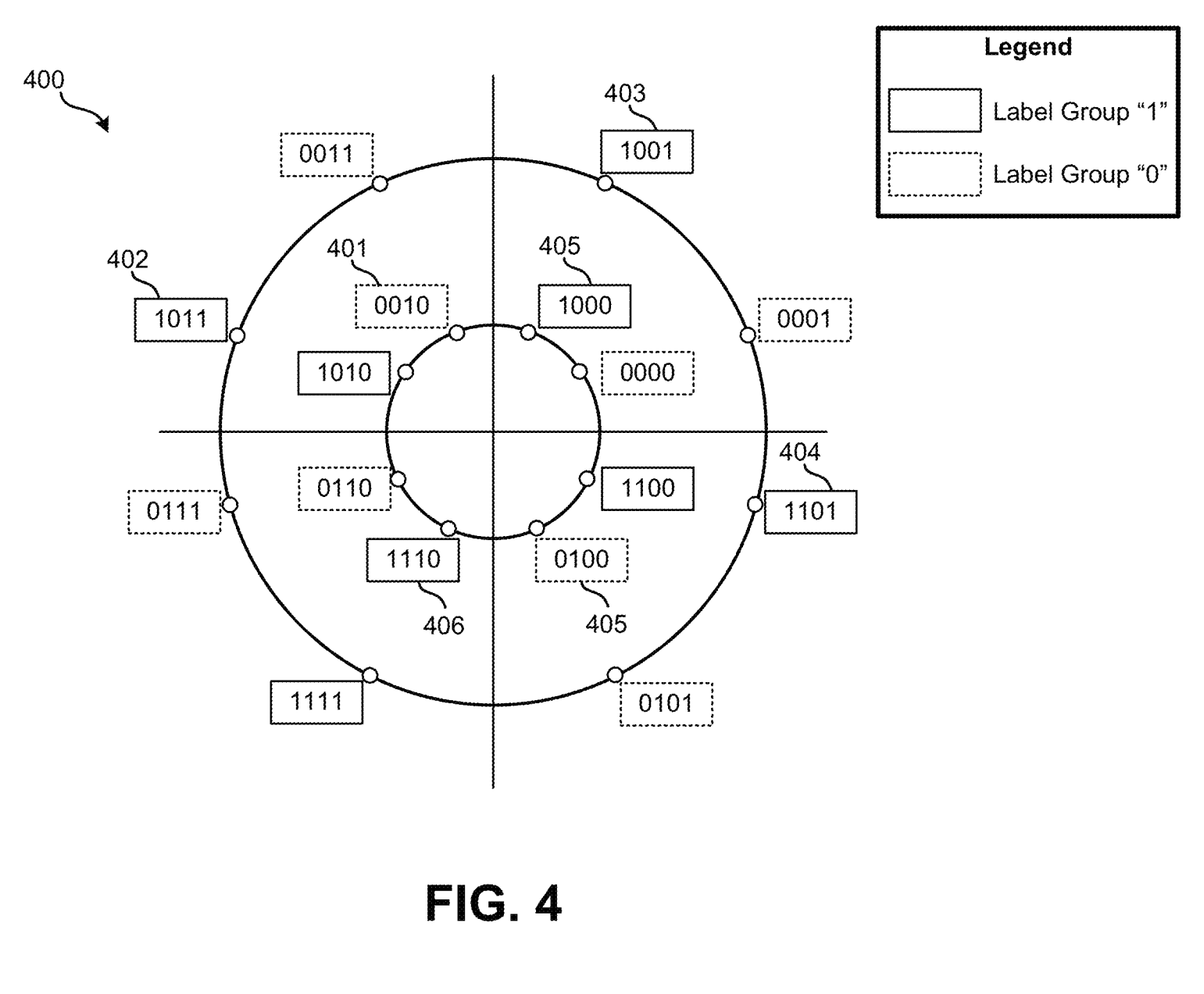
FIG. 4 illustrates an embodiment of a constellation using optimized 16 symbol Amplitude and Phase-Shift Keying (APSK) labelling for a 25%/75% code split arrangement.

FIG. 4 illustrates an embodiment 400 of a constellation using optimized 16 symbol Amplitude and Phase-Shift Keying (APSK) labelling for a 25% code split arrangement. Therefore, referring to FIG. 3, as an example, a packet can include codeword portion 310 and codeword portion 315. A first most-significant bit of each symbol corresponds to a bit from codeword portion 310; the final three bits of each symbol correspond to bits from codeword portion 315.

Since only a single bit of each symbol corresponds to codeword portion 310, there are only two possibilities of how this bit can be decoded from the symbol: as a zero or a one. If the entirety of this codeword (in this example, codeword 301) is determined to be properly decoded, then 50% of the available symbols on the constellation can be eliminated from consideration for determining the three bits that correspond to the portion of the second codeword (in this example, codeword portion 315 of codeword 302). Referring to FIG. 2, if a first codeword is determined to be properly decoded (e.g., codeword 301 of FIG. 3), data based on codeword portion 310, which is known to be correct, can be fed back to LLR computation engine 220 for use in narrowing the number of possibilities on optimized constellation mapping 225.

As shown in FIG. 4, two label groups are present. A first label group, which includes label 401, has a most significant bit (MSB) of zero and is further identified using a broken line box. A second label group, which includes label 402, has a MSB of one and is further identified using a solid line box. Depending on what codeword portion 310 is determined to be, all labels without the correct MSB can be eliminated from consideration. Therefore, either the first label group or the second label group can be eliminated from consideration when attempting to identify the correct symbol. At a same radius from the origin, adjacent symbols on the optimized constellation alternate between being members of label groups 1 and 0. Therefore, more noise can be tolerated since fewer symbols are possibly correct on the constellation. In this 16 APSK arrangement using 25% code splitting, at a given radius from the origin of the axes, no label is part of a same group as an adjacent label.

Once the MSB has been determined, either the group with the MSB of 1 or the group with the MSB of 0 can be ignored. For example, in FIG. 4, if the MSB is determined to be 1, label group 0 identified with broken lines can be ignored. Within label group 1, Gray labelling is maintained. For example, label 403 is properly Gray labelled with respect to label 404, label 405, and label 402 within the same label group. However, while Gray labelling is present between many adjacent labels irrespective of label group, in some instances, Gray labelling is not present between adjacent labels in different label groups. For example, label 406 and label 405 are not Gray labelled due the difference of two bits. However, Gray labelling is present for the three LSBs throughout the constellation. This modified Gray labeling is a tradeoff in order to optimize separation of label groups while maintaining Gray labelling within each label group.

Figure 5:
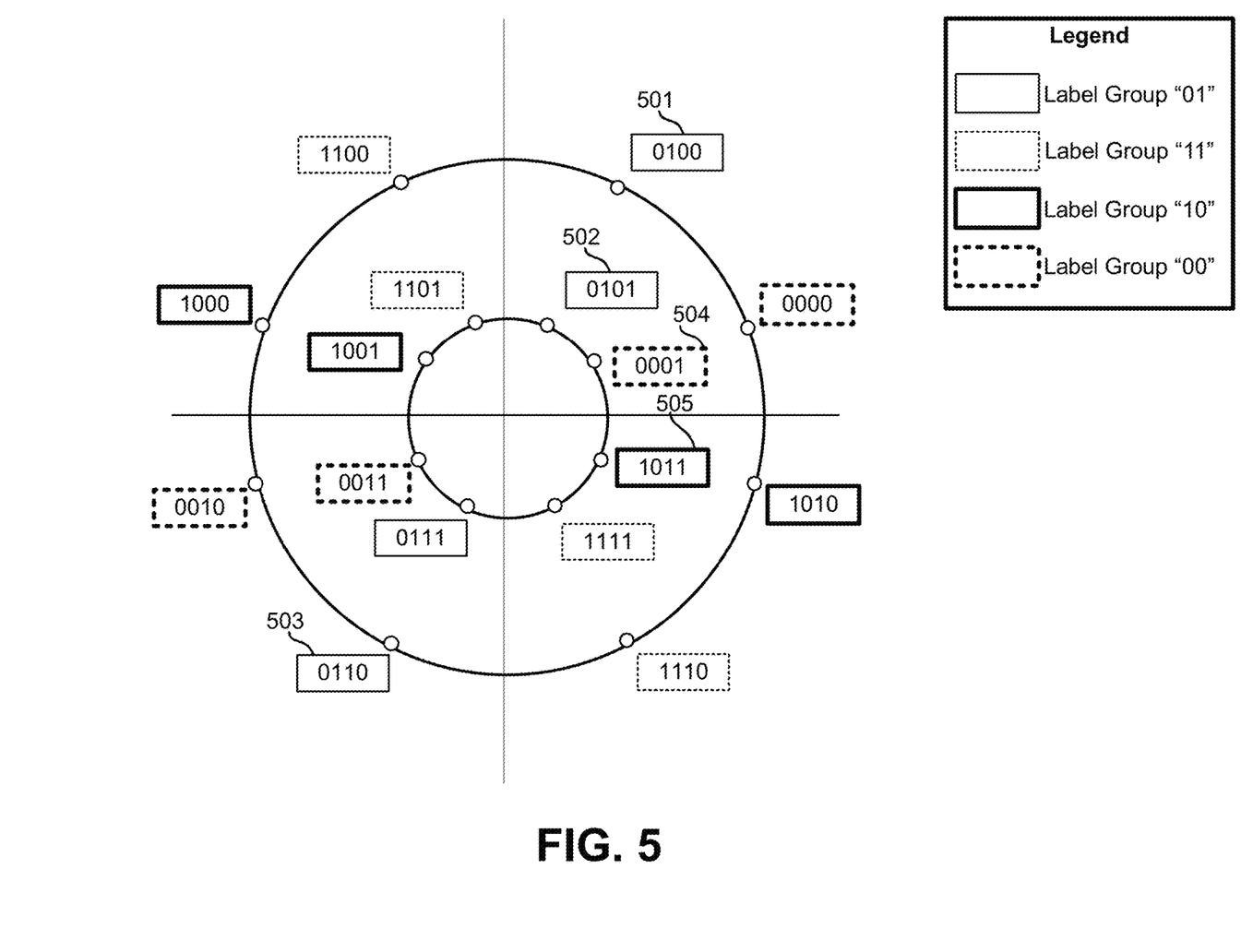
FIG. 5 illustrates an embodiment of a constellation using optimized 16 APSK constellation symbol labeling for a 50%/50% code split arrangement.

FIG. 5 illustrates an embodiment of a constellation using optimized 16 APSK constellation symbol labeling for a 50% code split arrangement. In contrast to the arrangement of FIG. 4, in FIG. 5, the two MSBs of each symbol correspond to a first codeword and the two least significant bits (LSBs) of each symbol correspond to a second codeword. Therefore, four label groups are present: 00, 01, 11, and 10, each identified with a different patterned outline in FIG. 5. In this 16 APSK arrangement using 50% code splitting, at a given radius, no label is part of a same group as an adjacent label.

Referring back to FIG. 3, for a given symbol, depending on what codeword portion 310 is determined to be, all labels without the correct MSBs can be eliminated from consideration. Therefore, for any given symbol, three of the four label groups are eliminated from consideration when attempting to identify the correct symbol. Therefore, more noise can be tolerated since fewer symbols are possibly correct on the constellation. In the embodiment of FIG. 5, each label group of the plurality of label groups includes two symbols associated with each radius from the origin on the labeled constellation.

Once the MSBs of a given symbol have been properly determined, all other label groups can be ignored. For example, in FIG. 5, if the MSBs are determined to be "01," label groups "11," "10" and "00" can be ignored. Within label group "01," Gray labelling is maintained. For example, label 501, label 502, symbol 0111, and label 503 within the same label group are Gray labeled. However, while Gray labelling is present between many adjacent labels irrespective of label group, in some instances, Gray labelling is not present between adjacent labels in different label groups. For example, label 504 and label 505 are not Gray labelled due the difference of two bits. However, Gray labelling is present for the two MSBs and Gray labelling is present for the two LSBs throughout the constellation. As an example of this, again consider labels 504 and 505: for the two MSBs used for the label groups, Gray labeling is present between these points. Separately, Gray labelling is present for the two LSBs. While in combination, Gray labelling is not present, when the portions corresponding to the first codeword and the second codeword are considered separately, Gray labeling is present. This modified Gray labeling can help optimize separation of label groups while maintaining Gray labelling within each label group.

Figure 6:
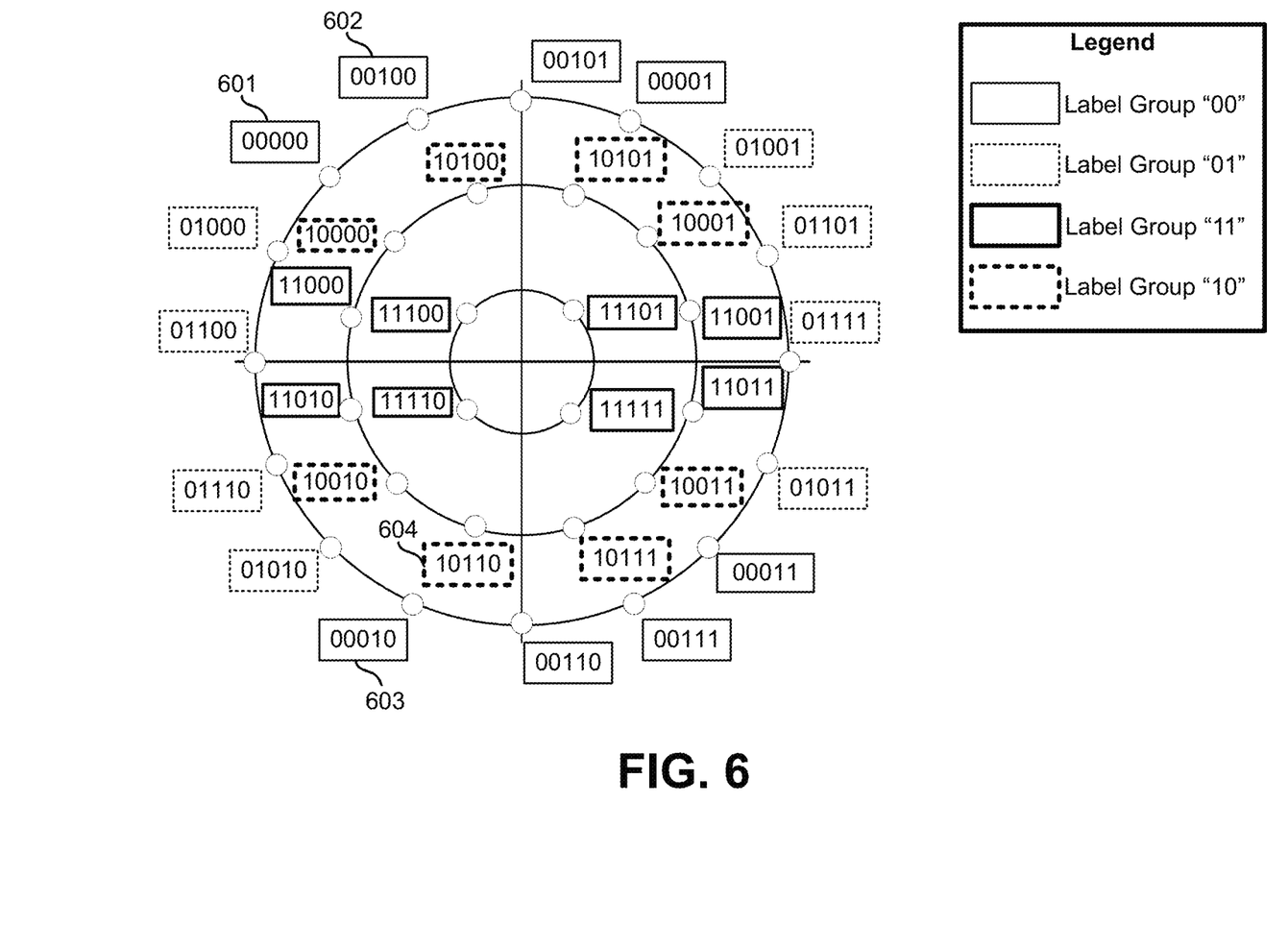
FIG. 6 illustrates an embodiment of a constellation using optimized 32 symbol labelling for a 60%/40% code split arrangement.

FIG. 6 illustrates an embodiment of a constellation using an optimized 32 APSK constellation symbol labeling for a 40%/60% code split arrangement. Similar to the arrangement of FIG. 5, the constellation labelling of FIG. 6 involves the two MSBs of each symbol corresponding to a first codeword. Here, the three least significant bits (LSBs) of each symbol correspond to a second codeword. Since two bits are again used for the first codeword portion, four label groups are present: 00, 01, 11, and 10, each identified with a different patterned outline in FIG. 6.

Referring back to FIG. 3, for a given symbol, depending on what the value of codeword portion 310 is determined to be, all labels without the correct MSBs can be eliminated from consideration. Therefore, for any given symbol, three of the four label groups are eliminated from consideration when attempting to identify the correct symbol. Therefore, more noise can be tolerated since fewer symbols are possibly correct on the constellation.

Once the MSBs of a given symbol have been properly determined, all other label groups can be ignored. In FIG. 6, if the MSBs are determined to be "00," label groups "11," "10" and "01" can be ignored. Within label group "00" (and other label groups), Gray labelling is maintained. For example, label 601 is properly Gray labelled with respect to label 602 and label 603 within the same label group. However, while Gray labelling is present between many adjacent labels irrespective of label group, in some instances, Gray labelling is not present between adjacent labels in different label groups. For example, label 603 and label 604 are not Gray labelled due the difference of two bits. However, Gray labeling can be present for the three LSBs throughout the constellation. This modified Gray labeling is a tradeoff in order to optimize separation of label groups while maintaining Gray labelling within each label group.

In the non-standard constellation of FIG. 6, each constellation point of three label groups may have a same radius. The fourth label group may have points having two radii from the origin of the axes. Further, Gray labelling is present for the two MSBs.

Figure 7:
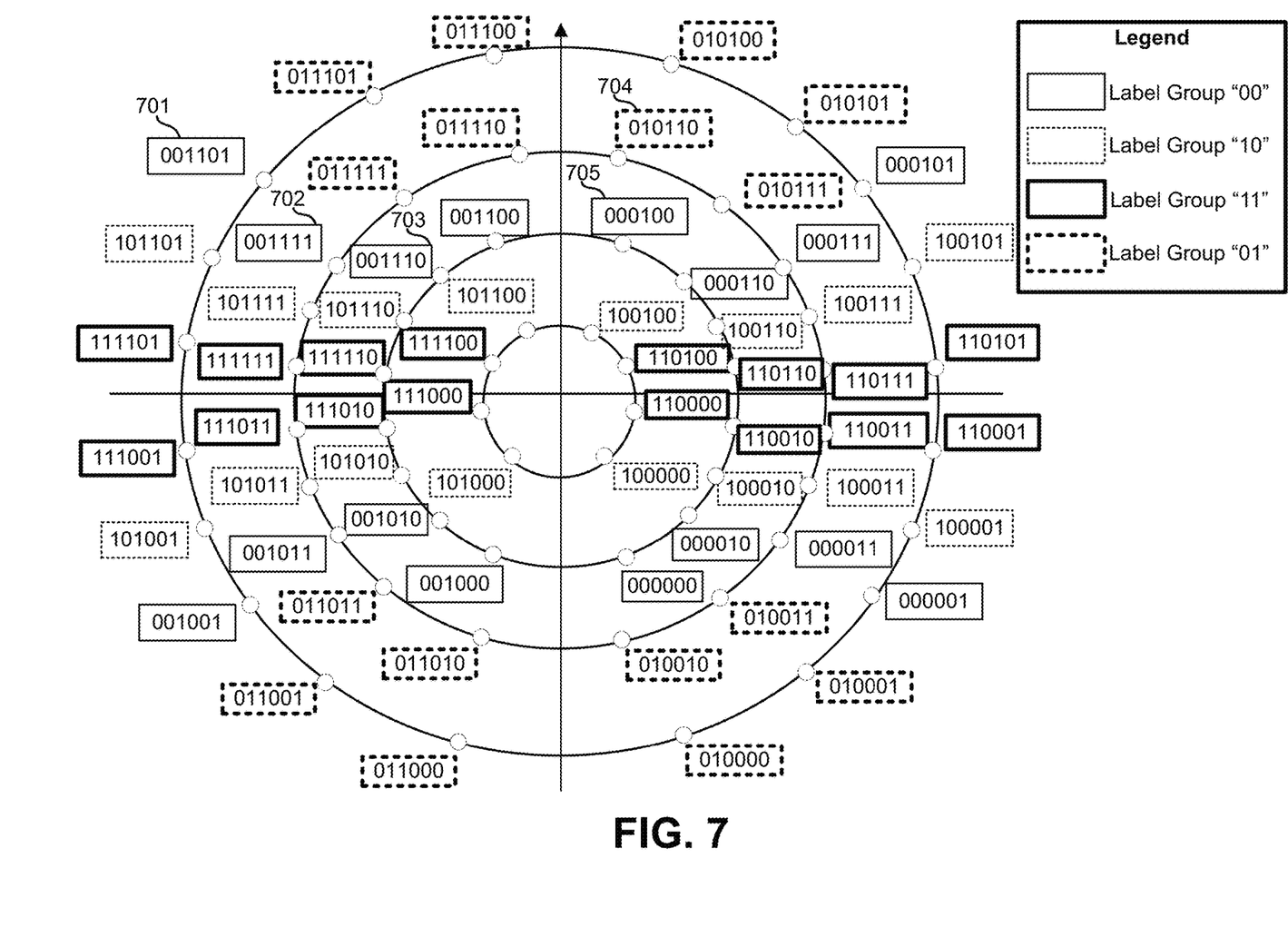
FIG. 7 illustrates an embodiment of a constellation using optimized 64 symbol labelling for a 67%/33% code split arrangement.

FIG. 7 illustrates an embodiment of a constellation using a non-standard 64 APSK symbol labelling for a 33%/67% code split arrangement. Similar to the arrangement of FIG. 6, the constellation labelling of FIG. 7 involves the two MSBs of each symbol corresponding to a first codeword. Here, the four least significant bits (LSBs) of each symbol correspond to a second codeword. Since two bits are again used for the first codeword portion, four label groups are present: 00, 01, 11, and 10, each identified with a different patterned outline in FIG. 7.

Referring back to FIG. 3, for a given symbol, depending on what the value of codeword portion 310 is determined to be, all labels without the correct MSBs can be eliminated from consideration by LLR computation engine 220. Therefore, for any given symbol, three of the four label groups are eliminated from consideration when attempting to identify the correct symbol. Therefore, more noise can be tolerated since fewer symbols are possibly correct on the constellation.

Once the MSBs of a given symbol have been properly determined, all other label groups can be ignored. In FIG. 7, if the MSBs are determined to be "00," label groups "11," "10" and "01" can be ignored. Within label group "00" (and other label groups), Gray labelling is maintained. For example, label 702 is properly Gray labelled with respect to label 701 and label 703 within the same label group. However, while Gray labeling is present between many adjacent labels irrespective of label group, in some instances, Gray labelling is not present between adjacent labels in different label groups. For example, label 704 and label 705 are not Gray labelled due the difference of two bits. However, Gray labeling is separately present for the two MSBs and Gray labelling is present for the four LSBs throughout the constellation. This modified Gray labeling is a tradeoff in order to optimize separation of label groups while maintaining Gray labelling within each label group. This imperfect Gray labeling is a tradeoff in order to optimize separation of label groups while maintaining Gray labelling within each label group.

In the non-standard constellation of FIG. 7, the constellation points of one label group have one of two radii, the constellation points of a second label group have one of three radii, and the remaining two groups have constellation points having one of four radii. Further, Gray labelling is present for the two MSBs.

While the preceding examples are focused on APSK constellations, in other embodiments, the same concepts can be applied to create non-standard quadrature amplitude modulation (QAM) constellations.

The arrangements detailed in relation to FIGS. 3 through 7 assume that the first codeword portion (e.g., codeword portion 310 of codeword 301) was decoded correctly. However, alternative arrangements must be made to decode the other bits of the packet (e.g., codeword portion 315) if it is determined that codeword portion 310 was not decoded properly. Referring back to FIG. 2, after decoder 240 has received two packets and can decode an entire codeword (e.g., codeword 301), decoder 240 can determine, such as based on using embedded error correcting data in the codeword, whether codeword 301 was properly decoded or not. When a determination is made that the codeword was not decoded properly, an optimized algorithm to attempt to properly decode the remaining bits may be overly complex to be implemented by certain hardware and/or software, such as UE 150 and/or gateway system 110.

Figure 8:
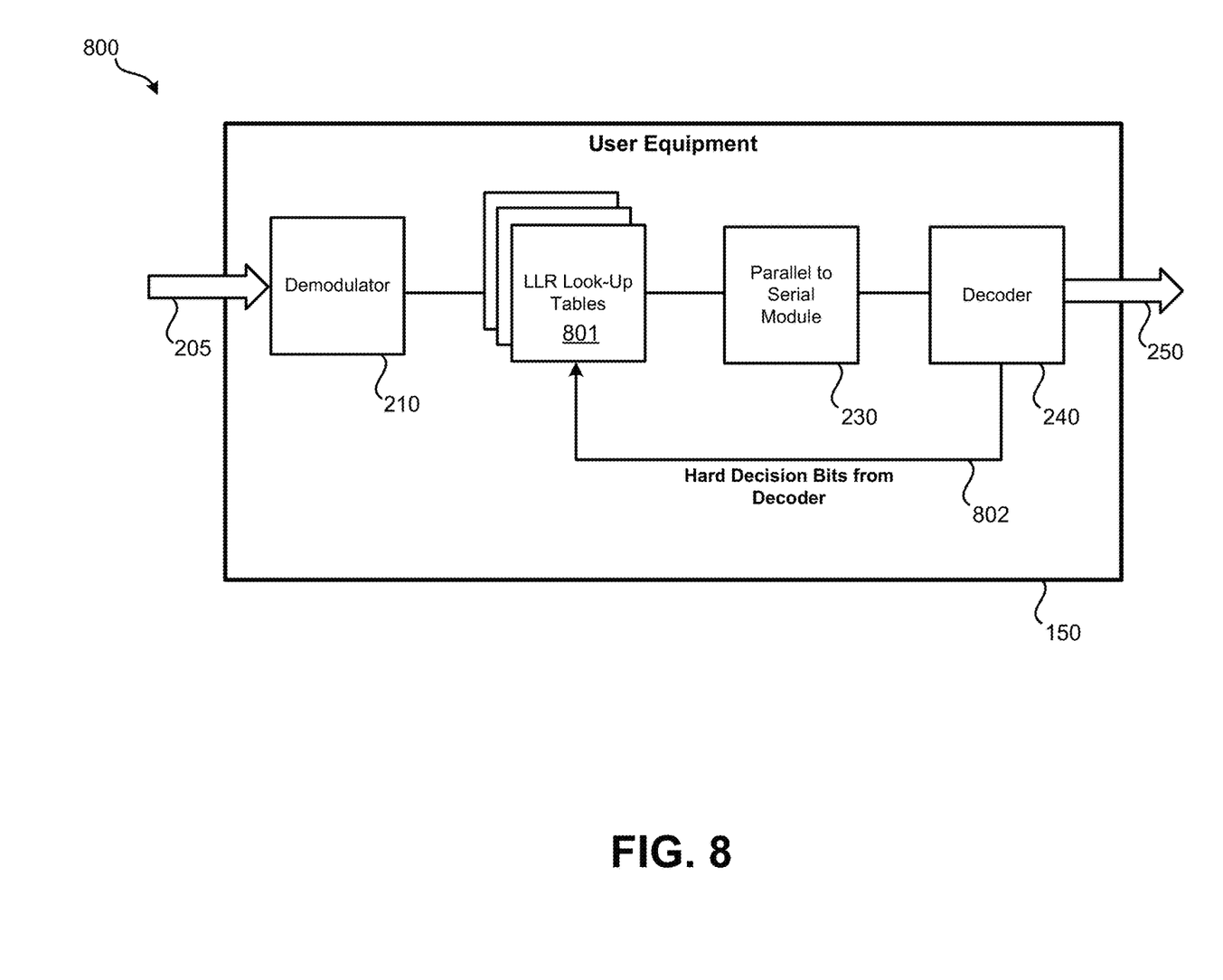
FIG. 8 illustrates an embodiment of user equipment that uses code splitting and an optimized constellation with multiple look-up tables that store decoder inputs.

FIG. 8 illustrates an embodiment 800 of user equipment 150 that uses code splitting and an optimized constellation with multiple look-up tables. When an error is present in decoding a codeword, typically the error involves only a small number of bits relative to the size of the codeword. Rather than performing a complicated calculation, look-up tables that include pre-computed values based on the magnitude of the MSBs of codeword portion 310 can be leveraged for the various non-standard or optimized constellations as detailed herein.

Complicated LLR computations can be performed off-line and stored in look-up tables based on the assumption that the previous codeword has been correctly decoded, which would include the MSB bits having been correctly decoded. Even in the case when the previous codeword was not correctly decoded, the same look-up tables can be used with satisfactory performance because when a decoder does not converge to the correct codeword, there are only a small of number of bits in error. Therefore, even though a wrong look-up table may occasionally be chosen to feed imperfect LLR values to the decoder regarding the subsequent codeword, the decoder can still manage to converge to the correct codeword.

In general, for a $2^m$ constellation having p bits from the previous codeword (e.g., codeword 301) and m–p bits from a current codeword (e.g., codeword 302), the total number of tables needed is according to Equation 1:

$$p+(m-p)2^p \qquad \text{Eq. 1}$$

Therefore, as an example, for 32 APSK with 40%/60% code splitting (in which p=2, and m=5), 14 look-up tables need to be precomputed with LLR values.

FIG. 8 illustrates an embodiment of user equipment 150 that uses a non-transitory processor-readable medium to store one or more look-up tables. When a codeword is determined to have an error by decoder 240, the feedback 802 can still be assumed to be correct. So the same look-up tables, LLR look-up tables 801, can be used whether or not the decoder feedback contains errors. While the illustrated embodiment uses multiple look-up tables, it should be understood that alternative data storage arrangements can be used to store similar data. An example of an LLR look-up table is provided in relation to FIG. 11.

The use of look-up tables replaces the need for on-the-fly probability calculations. Rather, LLR look-up tables 801 can be used to perform a look-up based on a value and measured magnitude of the value. Stored within the LLR look-up tables 801 are precomputed probabilistic likelihood values for use in determining values of a codeword. LLR look-up tables 801 can be based on the non-standard constellations detailed herein. These values are precomputed and stored offline such that UE 150 does not need to calculate them on-the-fly when needed. For example, referring to FIG. 3, regardless an error is present or not in codeword 301, feedback 802 indicates codeword portion 310 and the magnitude of each bit within codeword portion 310. Codeword portion 310 can be assumed to be correct, but LLR look-up tables 801 can be used based on the value and magnitude of each bit in codeword portion 310 to determine the values of codeword portion 315 of codeword 302. A separate look-up table can be used for each possible combination of codeword portion 310. For example, if only two possibilities are available, such as for 16 APSK with 25%/75% code splitting, the look-up table may be selected based on whether the measured value was "1" or "0." As another example, for 16 APSK with 50% code splitting, the look-up table may be selected based on whether the measured value in the codeword 301 was: "00," "01," "10," or "11".

Figure 11:
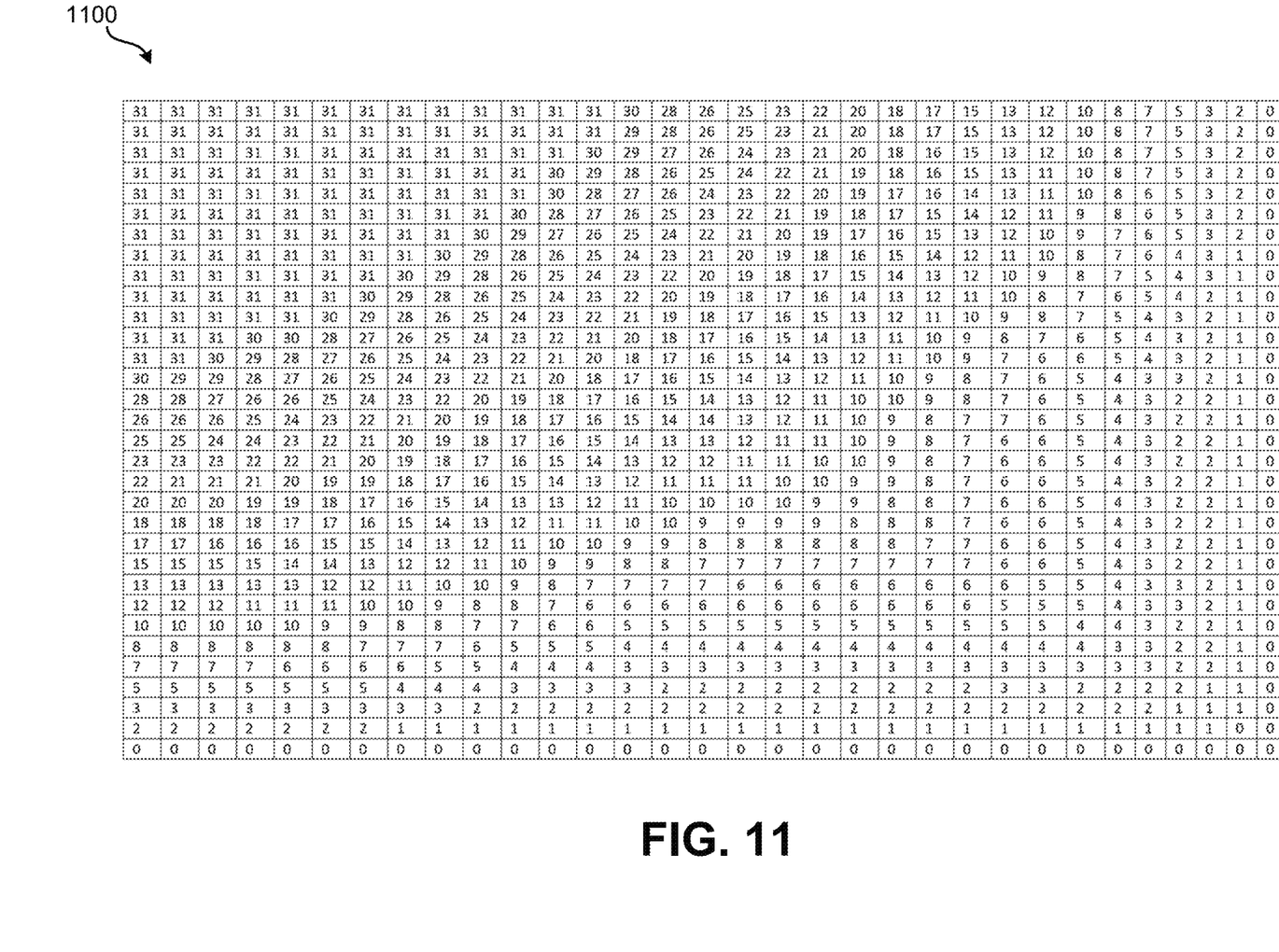
FIG. 11 represents an example of an LLR look-up table that can be used for the first bit of a 4-bit 16 APSK label.

Table 1100 of FIG. 11 represents an example of an LLR look-up table that can be used for the first bit of a 4-bit 16 APSK label. The output value from the table is a soft LLR value regarding the first bit of the 4-bit 16 APSK label. The output is then fed to the decoder as a soft decision of the demodulator based on I/Q noisy channel reception. If the sign of the output is positive, this means the demodulator thinks the first bit of the 4 is 0; whereas if the sign is negative the demodulator thinks the first bit is 1. The magnitude of the output signals how confident the demodulator is. The higher the magnitude is, the more confident the demodulator is.

A particular row and column are selected based on the noisy channel reception as analyzed using the non-standard 16 APSK constellation. Table 1100, for example, covers one quadrant of the possible space on the non-standard constellation. There is symmetry in a 16 APSK constellation, therefore output values corresponding to the other 3 quadrants are either a mirror image, negated mirror image, or some rotated versions of output value specified in table 1100.

As an example, another LLR look-up table can be used for another bit. For example, the soft LLR value regarding the third bit would use a different, particular table under the assumption that the first two bits are 0 and 1 (thanks to code splitting). Therefore, for the third bit in this example, four LLR tables are needed to correspond to each of the possible combination of the first two bits (00, 01, 10, 11).

Figure 9:
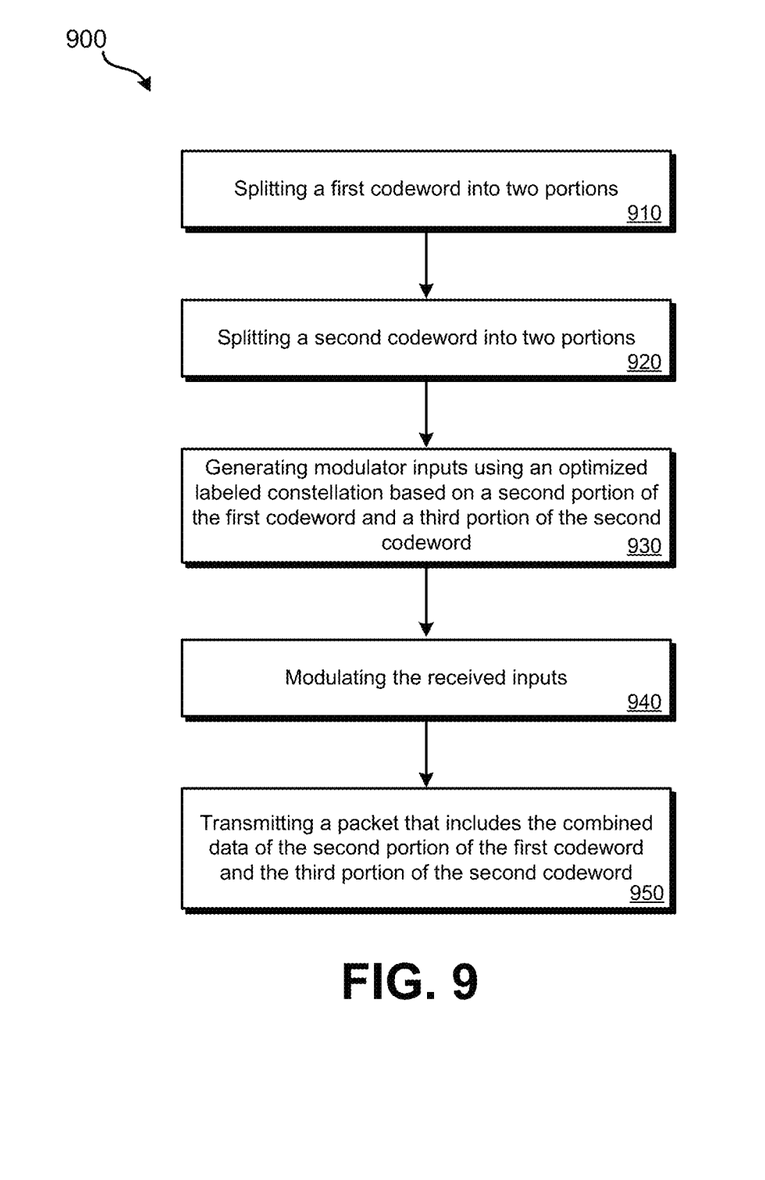
FIG. 9 illustrates an embodiment of a method for improving performance of code split communications.

Various methods may be performed using the arrangements detailed in FIGS. 1-8. FIG. 9 illustrates an embodiment of a method 900 for improving performance of code split communications. Method 900 may be performed by a system or device that is to transmit data, such as UE 150 or gateway system 110.

At block 910, a first codeword can be split into two portions. For example, referring to FIG. 3, codeword 301 can be split into codeword portion 305 and codeword portion 310. Depending on the modulation scheme to be used, the codeword splitting percentage can be used to determine how many bits should be present in the respective portions of the codeword. At block 920, a second codeword can be split into two portions. For example, referring to FIG. 3, codeword 302 can be split into codeword portion 315 and codeword portion 320.

At block 930, modulator inputs can be generated using an optimized or non-standard constellation, such as those detailed in relation to FIGS. 4-7, based on the second portion of the first codeword and the first portion of the second codeword. Referring to FIG. 3, the packet to be transmitted can be constructed using codeword portion 310 and codeword portion 315. Each modulator input can include some number of bits (e.g., 1, 2, etc.) from codeword portion 310 and some number of bits from codeword portion 315. At block 940, based upon the symbol determined from the non-standard constellation, modulation is performed according to the selected digital modulation scheme.

At block 950, the packet that includes data from the first codeword and second codeword can be transmitted, such as wirelessly via a satellite to a UE.

Figure 10:
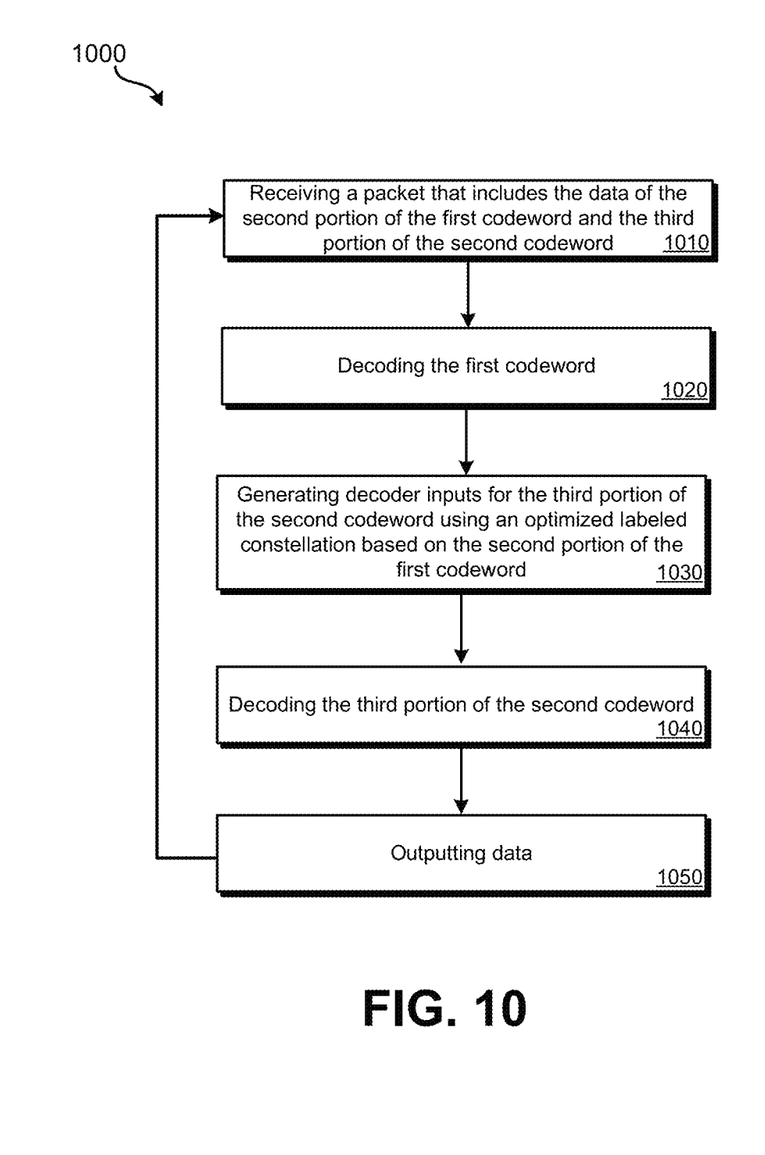
FIG. 10 illustrates another embodiment of a method for improving performance of code split communications.

FIG. 10 illustrates an embodiment of a method 1000 for improving performance of code split communications. Method 1000 may be performed by a system or device that is to receive data, such as UE 150 or gateway system 110.

At block 1010, a packet can be received that includes the data of the second portion of the first codeword and the third portion of the second codeword. This packet can correspond to the packet transmitted at block 950. Referring to FIG. 3, the received packet can, for example, include codeword portion 310 of codeword 301 and codeword portion 315 of codeword 302.

At block 1020, the first codeword may be decoded in order to obtain the second portion of the first codeword. The decoder can determine whether the first codeword was properly decoded or not. Method 1000 assumes that the first codeword was properly decoded. If not, determination of the third portion of the second codeword can be performed as detailed in relation to FIG. 8.

At block 1030, decoder inputs are generated for the third portion of the second codeword using the optimized or non-standard labelled constellation using the second portion of the first codeword. As previously detailed, depending on the digital modulation scheme used and the percentage code splitting, some number of the MSBs of each symbol, which correspond to the second portion of the first codeword, can be used to select a particular label group on the non-standard labeled constellation. Since the second portion of the first codeword is known to be correct (because the decoder already determined that first codeword was properly decoded at block 1020), the particular label group can be selected as a hard decision. All other label groups can be excluded from consideration, thus allowing for greater toleration of error since other label groups have been eliminated from consideration.

At block 1040, the third portion of the second codeword (along with the fourth portion of the second codeword, which was received as part of the next packet) is decoded. While not illustrated in FIG. 10, prior to decoding the third portion of the second codeword, the remainder of the second codeword needs to be received. As such, a fourth portion of the second codeword is received prior to block 1040 being performed. At block 1050, the decoded data from the second codeword is output, such as to another system or component. The blocks of method 1000 can repeat to decode successive codewords in the cascading arrangement of FIG. 3.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known, processes, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A method for improving performance of code split communications, the method comprising:
   splitting, by a transmission system, a first codeword into a first portion and a second portion;
   splitting, by the transmission system, a second codeword into a third portion and a fourth portion;
   transmitting, by the transmission system, the second portion of the first codeword and the third portion of the second codeword together as a plurality of symbols such that each transmitted symbol of the plurality of symbols comprises a first number of bits from the second portion of the first codeword and a second number of bits from the third portion of the second codeword;
   decoding, by a receiver system, the first codeword such that the first portion and the second portion of the first codeword are determined to be properly decoded; and
   generating, by the receiver system, decoder inputs for the third portion of the second codeword using an optimized constellation and the second portion of the first codeword, wherein:
      the second portion of the first codeword is used to identify a label group of a plurality of label groups of the optimized constellation and eliminate all other label groups of the plurality of label groups;
      within each label group of the plurality of label groups, symbol labels are Gray labeled; and
      at least a first symbol label is not Gray labeled with an adjacent second symbol label, the first symbol label and the adjacent second symbol label being members of different label groups of the plurality of label groups.

2. The method of claim 1, wherein the optimized constellation is an optimized 16 symbol Amplitude and Phase-Shift Keying (APSK) constellation.

3. The method of claim 2, wherein:
   the first number of bits is one and the second number of bits is three; and
   at a same radius from the origin, adjacent symbols on the optimized constellation alternate between being members of a first label group and a second label group.

4. The method of claim 2, wherein:
   the first number of bits is two and the second number of bits is two; and
   each label group of the plurality of label groups includes two symbols associated with each radius from the origin.

5. The method of claim 1, wherein the optimized constellation is an optimized 32 symbol APSK constellation.

6. The method of claim 5, wherein three label groups of the plurality of label groups each include eight symbols associated with a radius from the origin of the optimized constellation.

7. The method of claim 6, wherein the first number of bits is two and the second number of bits is three.

8. The method of claim 1, wherein the optimized constellation is an optimized 64 symbol Amplitude and Phase-Shift Keying (APSK) constellation.

9. The method of claim 8, wherein:
   two label groups of the plurality of label groups each has four symbols associated with each radius of a set of four possible radii from the origin of the optimized constellation; and
   one label group of the plurality of label groups has eight symbols associated with a first radius and eight symbols associated with a radius amplitude.

10. The method of claim 1, wherein generating, by the receiver system, decoder inputs for the third portion of the second codeword is performed using the second portion of the first codeword and one or more precomputed log-likelihood ratio (LLR) tables that are based on the optimized constellation.

11. A system for improving performance of code split communications, the system comprising:
   a satellite gateway system configured to:
      split a first codeword into a first portion and a second portion;
      split a second codeword into a third portion and a fourth portion; and
      transmit the second portion of the first codeword and the third portion of the second codeword together as a plurality of symbols such that each transmitted symbol of the plurality of symbols comprises a first number of bits from the second portion of the first codeword and a second number of bits from the third portion of the second codeword; and
   a receiver system, configured to:
      receive the first codeword and the second codeword via a satellite antenna;
      decode the first codeword such that the first portion and the second portion of the first codeword are determined to be properly decoded; and
      generate decoder inputs for the third portion of the second codeword using an optimized constellation and the second portion of the first codeword, wherein:
         the second portion of the first codeword is used to identify a label group of a plurality of label groups of the optimized constellation and eliminate all other label groups of the plurality of label groups;
         within each label group of the plurality of label groups, symbol labels are Gray labeled; and
         at least a first symbol label is not Gray labeled with an adjacent second symbol label, the first symbol label and the second symbol label being members of different label groups of the plurality of label groups.

12. The system of claim 11, wherein the optimized constellation is an optimized 16 symbol Amplitude and Phase-Shift Keying (APSK) constellation.

13. The system of claim 12, wherein:
the first number of bits is one and the second number of bits is three; and
at a same radius from the origin, adjacent symbols on the optimized constellation alternate between being members of a first label group and a second label group.

14. The system of claim 12, wherein:
the first number of bits is two and the second number of bits is two; and
each label group of the plurality of label groups includes two symbols associated with each radius from the origin.

15. The system of claim 11, wherein the optimized constellation is an optimized 32 symbol APSK constellation.

16. The system of claim 11, wherein the optimized constellation is an optimized 64 symbol Amplitude and Phase-Shift Keying (APSK) constellation.

17. The system of claim 16, wherein:
two label groups of the plurality of label groups each has four symbols associated with each radius of a set of four possible radii from the origin of the optimized constellation; and
one label group of the plurality of label groups has eight symbols associated with a first radius and eight symbols associated with a radius amplitude.

18. The system of claim 11, wherein the satellite gateway system is connected with the Internet and provides Internet access to the receiver system.

19. The system of claim 18, further comprising a satellite that relays communication signals between the satellite gateway system and the receiver system.

20. The system of claim 11, wherein the receiver system being configured to generate decoder inputs for the third portion of the second codeword is performed using the second portion of the first codeword and one or more precomputed log-likelihood ratio (LLR) tables that are based on the optimized constellation.

* * * * *